(12) United States Patent
Cannon et al.

(10) Patent No.: US 7,129,417 B2
(45) Date of Patent: Oct. 31, 2006

(54) METHOD AND STRUCTURES FOR IMPLEMENTING CUSTOMIZABLE DIELECTRIC PRINTED CIRCUIT CARD TRACES

(75) Inventors: Todd Arthur Cannon, Rochester, MN (US); William James Csongradi, Jr., Rochester, MN (US); Benjamin Aaron Fox, Rochester, MN (US); Roger John Gravrok, Eau Claire, WI (US); Mark Kenneth Hoffmeyer, Rochester, MN (US); David Lawrence Pease, Rochester, MN (US); Ryan James Schlichting, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 10/835,464

(22) Filed: Apr. 29, 2004

(65) Prior Publication Data

US 2005/0241850 A1    Nov. 3, 2005

(51) Int. Cl.
*H05K 1/03* (2006.01)
(52) U.S. Cl. .................. 174/255; 361/803; 361/777; 174/256
(58) Field of Classification Search ............ 174/255, 174/256, 261, 264, 260, 52.2, 267; 361/768, 361/767
See application file for complete search history.

(56) References Cited

U.S. PATENT DOCUMENTS

| | | | | |
|---|---|---|---|---|
| 3,809,797 A | * | 5/1974 | McMunn et al. ............ 428/551 |
| 5,790,377 A | * | 8/1998 | Schreiber et al. ........... 361/704 |
| 5,998,739 A | * | 12/1999 | Shirai ........................ 174/256 |
| 6,596,947 B1 | * | 7/2003 | Kurita et al. ................ 174/255 |
| 6,630,629 B1 | * | 10/2003 | Otsuka et al. ............... 174/255 |
| 6,633,005 B1 | * | 10/2003 | Ichitsubo et al. ........... 174/260 |
| 6,663,799 B1 | * | 12/2003 | Kokubo et al. ............. 252/512 |
| 6,800,946 B1 | * | 10/2004 | Chason et al. .............. 257/778 |
| 6,852,926 B1 | * | 2/2005 | Ma et al. .................... 174/52.2 |
| 6,869,750 B1 | * | 3/2005 | Zhang et al. ................ 430/312 |
| 6,903,452 B1 | * | 6/2005 | Ma et al. .................... 257/680 |
| 2002/0000649 A1 | * | 1/2002 | Tilmans et al. ............. 257/678 |
| 2004/0099441 A1 | * | 5/2004 | Ichiryu et al. .............. 174/266 |

* cited by examiner

*Primary Examiner*—Kamand Cuneo
*Assistant Examiner*—Hoa C. Nguyen
(74) *Attorney, Agent, or Firm*—Joan Pennington

(57) ABSTRACT

A method and structures are provided for implementing customizable dielectric printed circuit card traces. A void is defined near selected signal traces. The void is then filled with a dielectric material having a predefined dielectric property. The dielectric material is selected to alter at least one predefined electrical property of the selected signal traces, such as, coupling, propagation delay and attenuation. In one embodiment, an outer layer of a printed circuit card includes a plurality of signal traces and a mating circuit card layer including a plurality of matching signal traces is attached to the outer layer of the printed circuit card to create a cavity near selected signal traces. The cavity is filled with the selected dielectric material. In another embodiment, dielectric material is selectively removed near signal traces on an outer layer of the printed circuit card to define a void near selected signal traces.

5 Claims, 5 Drawing Sheets

METHOD AND STRUCTURES FOR IMPLEMENTING CUSTOMIZABLE DIELECTRIC PRINTED CIRCUIT CARD TRACES

FIELD OF THE INVENTION

The present invention relates generally to the field of electronic packaging including printed circuit cards and integrated circuit packages, and more particularly, relates to a method, and structures for implementing customizable dielectric printed circuit card traces for printed circuit cards and electronic packages.

DESCRIPTION OF THE RELATED ART

Increasing frequency and higher routing density of electrical signals on printed circuit cards require more selective use of dielectric materials to customize the transmission line properties of circuit card traces.

Customization goals may include reducing line electrical loss, reducing radiated emissions, reducing crosstalk and coupled noise, increasing coupling between wires of a differential pair, or increasing decoupling capacitance.

Traditional PC card fabrication techniques prohibit the modification of individual signal path dielectric materials, as the process relies upon a layering of similar material layers, producing an electrically homogeneous insulating structure. All traces on a given layer are constrained to the same dielectric environment, and therefore have similar electrical characteristics, which restrict design optimization.

A known method used for varying the dielectric properties of a printed circuit card is to change the type of core material used in its construction. One type of dielectric material, such as, FR4, NELCO 4000-13, or the like, is typically usually used for all of the dielectric layers of the card. While this known method does modify and can enhance the characteristics of the entire printed circuit card, it does not allow the flexibility to alter individual signal traces. Also enhanced core materials often command premium pricing.

A need exists for an effective mechanism for customizing the transmission line properties of circuit card traces.

SUMMARY OF THE INVENTION

Principal aspects of the present invention are to provide a method and structures for implementing customizable dielectric printed circuit card traces. Other important aspects of the present invention are to provide such method and structures for implementing customizable dielectric printed circuit card traces substantially without negative effect and that overcome many of the disadvantages of prior art arrangements.

In brief, a method and structures are provided for implementing customizable dielectric printed circuit card traces. A void is defined near selected signal traces. The void is then filled with a selected dielectric material having a predefined dielectric property. The dielectric material is selected to alter at least one predefined electrical property of the selected signal traces, such as, coupling, propagation delay and attenuation.

In one embodiment of the invention, an outer layer of a printed circuit card includes a plurality of signal traces. A mating circuit card layer including a plurality of matching signal traces is attached to the outer layer of the printed circuit card to create a cavity near selected signal traces. The cavity is filled with the selected dielectric material.

In another embodiment of the invention, dielectric material is selectively removed near signal traces on an outer layer of the printed circuit card to define the void near selected signal traces. The void optionally is then encapsulated by the attachment of a mating circuit card layer.

In accordance with features of the invention, the height or thickness of selected signal traces is optionally increased, for example, through electroplating selected signal traces. The mating circuit card layer is attached using a solder paste to solder together matching reference traces on the two board layers and provides both shielding and a reference plane structure for selected signal traces.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided for selectively creating individual dielectric regions. Customizable dielectric printed circuit card traces are provided by selectively manipulating the shapes and properties of dielectric materials near certain traces. The method of the invention makes use of lower cost core materials, while allowing the flexibility to modify selected wires for enhanced performance. This technique enables the localized optimization of what may typically be exclusive design requirements, now in the same card.

In accordance with features of the invention, the method creates signal lines on a printed circuit card with significantly altered and improved electrical properties. This may be accomplished by selectively removing dielectric material near signal layers on an outer layer or layers of the printed circuit card, and optionally increasing the thickness or height of the outer copper pedestal traces, for example, through electroplating selected pedestal traces. The resulting void is then either filled with a material that has different dielectric properties, such as a lower or higher dielectric constant, or is left open with an air dielectric. The void is then encapsulated by the attachment of a mating circuit card layer which provides both shielding and a reference-plane structure for the signals within the voids. A cap circuit card is attached using, for example, a low-temperature solder paste to solder together the matching pedestals on the two boards. When used for differential pairs, enhanced coupling of the differential pairs also advantageously is provided by allowing placement in a broadside fashion. A dielectric other than glass-epoxy may be chosen to either enhance coupling further or reduce the propagation delay.

Figure 1:
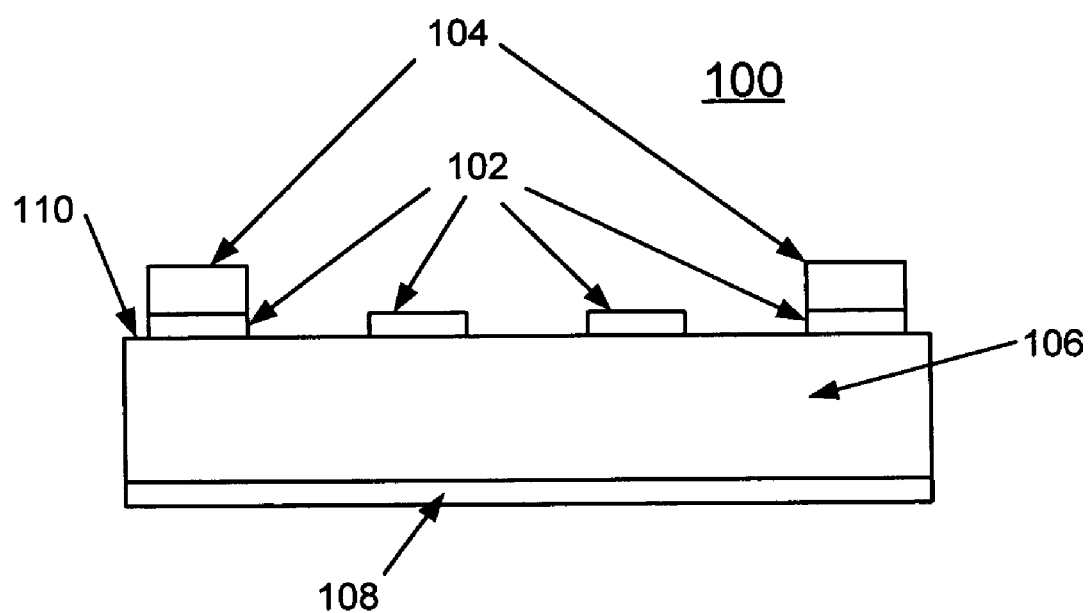
FIGS. 1, 2, 3, 4, and 5 are diagrams illustrating exemplary structures for implementing customizable dielectric printed circuit card traces in accordance with the preferred embodiments.

Having reference now to the drawings, in FIG. 1, there is shown an exemplary printed circuit card layer generally designated by the reference character 100 for implementing customizable dielectric printed circuit card traces 102 in accordance with the preferred embodiments.

In accordance with features of the invention, a significant advantage of this method over traditional printed circuit card fabrication methods is that the creation of signal paths selectively engineered with superior loss and isolation characteristics is made possible. This method allows for tuning of selected path dielectric characteristics. These are required improvements if the bandwidth of signals carried on printed circuit cards is to be extended from the current limits.

Figure 4:
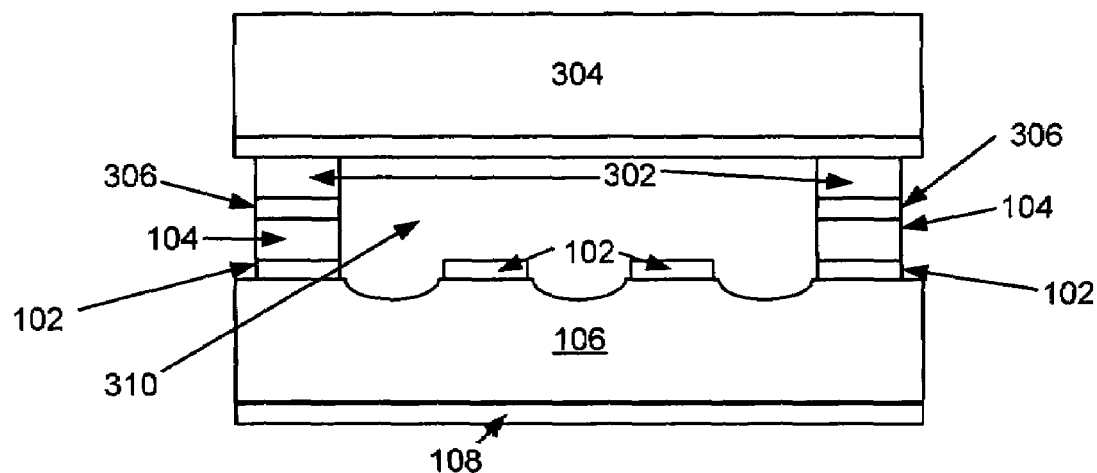

Referring to FIG. 1, during the board manufacturing process, a plurality of selected copper traces 102 optionally are plated up to increase their thickness, each creating an increased height or tall copper structure 104 in accordance with the preferred embodiments above a dielectric material generally designated by the reference character 106. The tall copper structures 104 may be provided around a perimeter of an area to be enclosed, for example, as illustrated in FIG. 4. The upper printed circuit card layer 100 includes a conductive layer 108 attached to the dielectric material 106.

Figure 2:
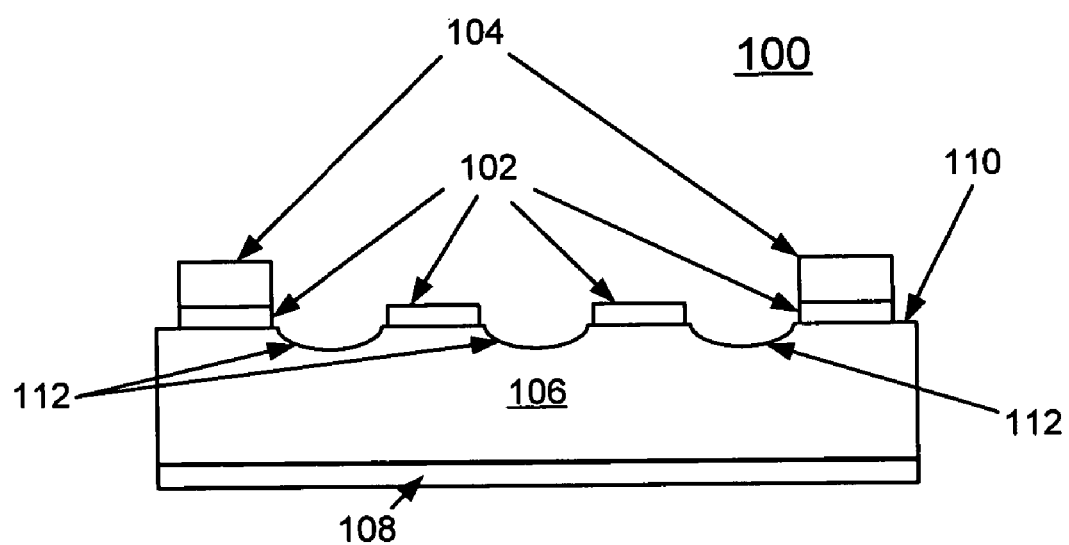

Referring to FIG. 2, during the board manufacturing process, a top layer 110 of the dielectric material 106 is selectively cut away, such as laser-cut away or etched to form a respective resulting void 112 between selected copper traces 102. Each resulting void or cavity 112 may be filled with a variety of dielectric materials, for example, PTFE, or left empty, effectively using air as a dielectric.

It should be understood that the present invention is not limited to the illustrated exemplary embodiments, the scope of the present invention can be applied, for example, to pattern and etch processes. Likewise the scope of the present invention can be applied, for example, to the optimization of dielectric shapes that may be achieved with conventional lithographic pattern and etch techniques.

Figure 3:
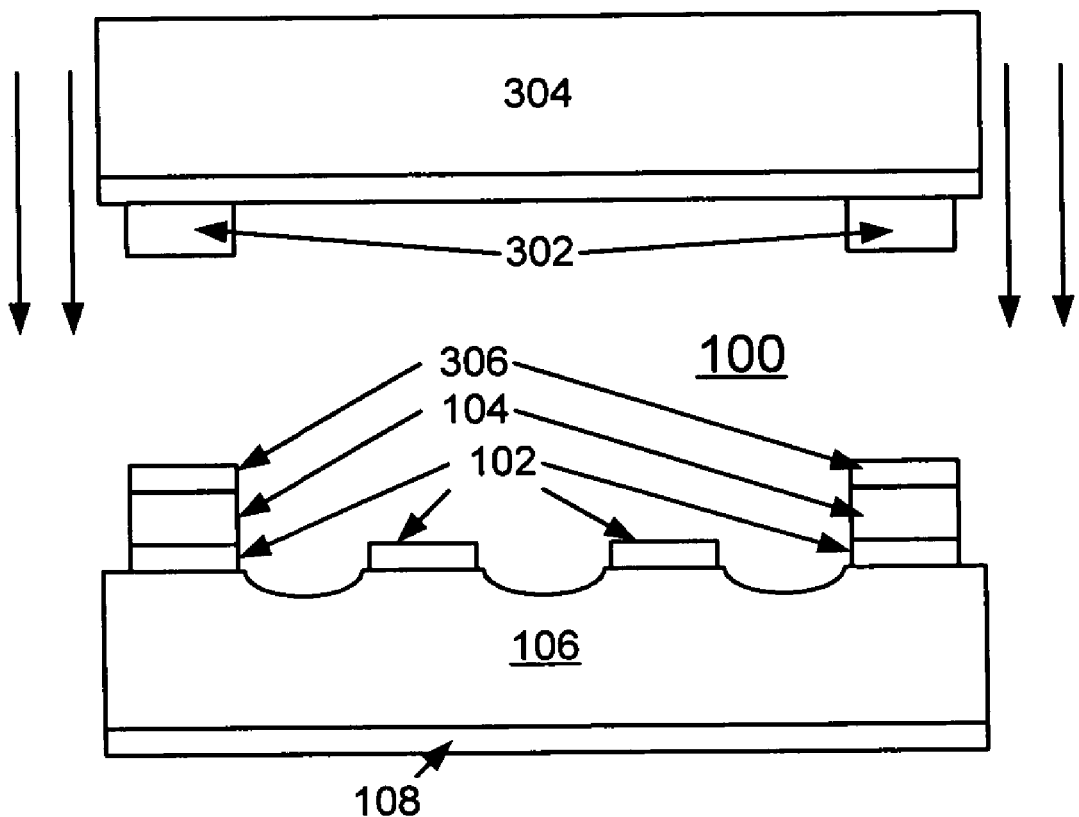

Referring now to FIGS. 3 and 4, a cap structure generally designated by the reference character 300, such as another printed circuit card that matches the corresponding printed circuit card is then mounted on top of the base printed circuit card 100. The cap structure 300 includes a pair of mating electrically conductive reference traces 302 extending downwardly below a dielectric layer 304 of the cap structure 300. The mating reference traces 302 are located around a perimeter of an area to be enclosed matching the tall copper structures 104.

The traces 302 of the cap structure 300 are connected to the tall copper structures 104 of the base printed circuit layer 100, for example, using a solder paste 306 reflowed to bond the printed circuit cards 100 and 300 together, as shown in FIG. 4.

Referring to in FIG. 4, an exemplary combined circuit structure generally designated by the reference character 400 includes an overall resulting cavity 310 in accordance with the preferred embodiments. The resulting cavity 310 is sealed through the attachment of the cap structure 300 to the base printed circuit layer 100 and possibly supplemented with additional sealants in areas where soldering the base and cap together in impractical. Cap structures 300 can be created in virtually any shape, and can be used to create areas of enhanced wiring within subsections of the printed circuit card 100, as needed.

In accordance with the preferred embodiments, the method of the invention provides a selective dielectric material near selected signal traces, combined with a wide variety of plating thicknesses, core materials/thicknesses, and signal trace configurations can be used to create many novel and beneficial circuit structures.

As shown in the exemplary combined circuit structure 400, low attenuation signal lines advantageously are provided in accordance with the preferred embodiments. The cavity 310 can be filled with air or another low-loss dielectric material to create very low-loss signal paths. Also isolated paths advantageously are provided in the exemplary combined circuit structure 400. The vertical and horizontal metal structures combined become a very effective shield around the signal to prevent both interference from outside emissions, and radiation from the signal itself. Any number of signals could be enclosed in the cavity 310 in accordance with the preferred embodiments.

The exemplary combined circuit structure 400 also enables variable impedance paths in accordance with the preferred embodiments. The use of a variety of cavity sizes, wire dimensions and spaces between traces, and dielectric fill materials provides a means for controlling the signal impedance and propagation delay of the signal lines. Paths for signals such as DRAM address lines can be created with a lower impedance than the rest of the card structure. Using this process to match card impedance to associated driver impedance can greatly improve signal transmission quality.

In accordance with the preferred embodiments, broadside coupled differential pairs, with a high-dielectric constant, low loss material near the differential pairs can be provided in accordance with the preferred embodiments. The close spacing and higher dielectric constant ensures tight electrical coupling within the pair, enhances signal integrity, decreases noise coupled to only one side of the pair and reduces signal loss.

Figure 5:
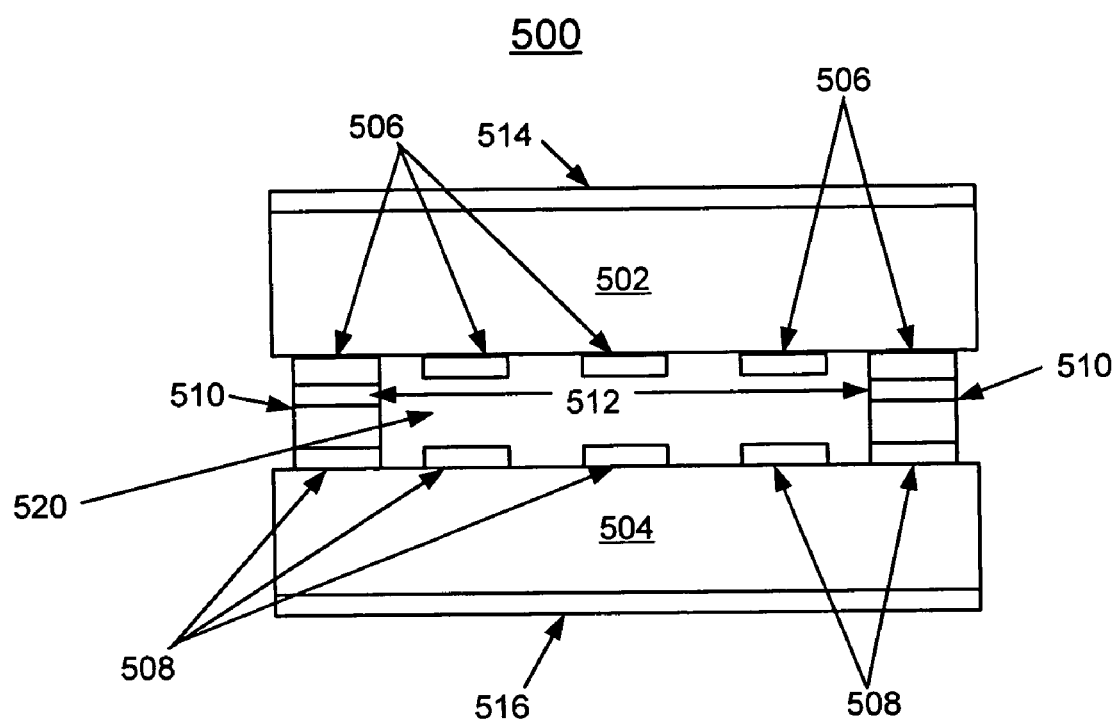

Referring now to FIG. 5, there is shown an exemplary differential pair structure generally designated by the reference character 500 in accordance with the preferred embodiments. The exemplary differential pair structure 500 includes a cap printed circuit card layer 502 and a base printed circuit card layer 504. The cap printed circuit card layer 502 includes a plurality of electrically conductive traces 506 extending downwardly from the dielectric cap layer. The base printed circuit card layer 504 includes a plurality of corresponding electrically conductive traces 508. A pair of selected perimeter copper traces 508 optionally are plated up to increase their thickness creating a pair of tall copper structures 510. The traces 506 of the cap structure 502 are connected to the tall copper structures 510 of the base printed circuit layer 504, for example, using a solder paste 512 reflowed to bond the printed circuit cards together, as shown. The cap printed circuit card layer 502 includes an upper electrically conductive layer 514. The base printed circuit card layer 504 includes a lower electrically conductive layer 516. Conductive layers 514 and 516 are connected to ground potential. A cavity is defined between the cap printed circuit card layer 502 and the base printed circuit card layer 504. The cavity 520 can be filled with air or a variety of other dielectric materials.

By providing closely spaced signal trace pairs 506, 508 and filing the cavity 520 with a selected high dielectric constant, low loss dielectric material creates enhanced electrical coupling between the closely spaced signal trace pairs. This also enhances signal integrity, and decreases noise coupled to only one side of the pair and reduces signal loss for the closely spaced signal trace pairs.

The electrically conductive layer 514 of the cap printed circuit card layer 502 and the lower electrically conductive layer 516 of the base printed circuit card layer 504 combined with the mating traces 506, 510 soldered together with conductive solder paste 512 bonding the printed circuit cards together and also connected to ground potential provides effective shielding for selected signal traces 506, 508.

An electrostatic discharge (ESD) protection device can be provided with a parallel plate structure similar to the differential pair structure 500 in FIG. 5 combined with a dielectric material having a predetermined breakdown voltage in order to protect sensitive circuits from ESD damage.

While the present invention has been described with reference to the details of the embodiments of the invention shown in the drawing, these details are not intended to limit the scope of the invention as claimed in the appended claims.

What is claimed is:

1. A structure for implementing customizable dielectric printed circuit card traces comprising:
   an outer layer of a printed circuit card including a plurality of signal traces;
   a mating circuit card layer including a plurality of matching signal traces; said mating circuit card layer attached to said outer layer to create a cavity near selected signal traces;
   said selected signal traces including predefined signal traces having a selected thickness being selectively increased by electroplating, and said selectively increased by electroplating traces surrounding a plurality of said signal trace;
   a selected dielectric material having a selected dielectric property filling said cavity; said dielectric material being selected to alter at least one predefined electrical property of the selected signal traces; said at least one predefined electrical property of the selected signal traces including at least one of coupling, propagation delay and attenuation;
   said outer layer of the printed circuit card having dielectric material selectively removed near selected signal traces providing a resulting void; and said selected dielectric material filling said void; and
   said mating circuit card layer being attached to said outer layer of the printed circuit card by soldering together selected mating traces of said mating circuit card layer and said selectively increased by electroplating traces of the outer layer of the printed circuit card.

2. A structure for implementing customizable dielectric printed circuit card traces as recited in claim 1 wherein said selected dielectric material includes an air dielectric.

3. A structure for implementing customizable dielectric printed circuit card traces as recited in claim 1 wherein said mating circuit card layer includes at least one electrically conductive layer for providing both shielding and a reference-plane structure for selected signal traces.

4. A structure for implementing customizable dielectric printed circuit card traces as recited in claim 1 wherein each of said mating circuit card layer and said outer layer of the printed circuit card includes a metal layer for shielding for selected signal traces.

5. A structure for implementing customizable dielectric printed circuit card traces comprising:
   an outer layer of a printed circuit card including a plurality of signal traces;
   a mating circuit card layer including a plurality of matching signal traces; said mating circuit card layer attached to said outer layer to create a cavity near selected signal traces; said mating circuit card layer having a selected shape for defining an area of enhanced electrical coupling between selected signal traces;
   said selected signal traces including predefined signal traces having a selected thickness being selectively increased by electroplating, and said selectively increased by electroplating traces surrounding a plurality of said signal trace;
   a selected dielectric material having a selected dielectric property filling said cavity; said dielectric material being selected to alter at least one predefined electrical property of the selected signal traces; said at least one predefined electrical property of the selected signal traces including at least one of coupling, propagation delay and attenuation; and
   said mating circuit card layer being attached to said outer layer of the printed circuit card by soldering together selected mating traces of said mating circuit card layer and said selectively increased by electroplating traces of the outer layer of the printed circuit card.

* * * * *